United States Patent [19]

Milkovic

[11] 4,066,959
[45] Jan. 3, 1978

[54] ELECTRONIC VOLT-SQUARE-HOUR METERING METHOD AND APPARATUS

[75] Inventor: Miran Milkovic, Scotia, N.Y.

[73] Assignee: General Electric Company, Schenectady, N.Y.

[21] Appl. No.: 755,398

[22] Filed: Dec. 29, 1976

[51] Int. Cl.² .......................................... G01R 21/06
[52] U.S. Cl. .................................. 324/141; 364/483
[58] Field of Search .............. 324/141, 142; 235/194; 307/225; 328/160

[56] References Cited

U.S. PATENT DOCUMENTS 3,760,273  9/1973  Burkett et al. ..................... 324/142

Primary Examiner—Stanley T. Krawczewicz
Attorney, Agent, or Firm—Robert E. Brunson; Philip L. Schlamp

[57] ABSTRACT

An electronic meter for measuring V²hr in an electrical system includes a center tapped transformer for deriving two analog signals proportional to a detected voltage in the system with the analog signals being 180° out of phase with respect to one another. A comparator compares a relatively high frequency triangular signal with a selected one of the analog signals with the output of the comparator driving a switch which acts as a multiplier. When a comparison exists the switch couples one of the analog signals to an integrator, and when a comparison does not exist, the switch couples the other analog signal to the integrator. The output of the comparator is a pulse width modulated signal having a time duration which is proportional to the amplitude of the detected voltage in the system, and the signal coupled to the integrator is a chopped analog signal having an amplitude proportional to the amplitude of the voltage in the system and a time duration proportional to the magnitude of the voltage. Accordingly, the integrator integrates a signal which is proportional to V². At the output of the integrator a signal is generated which is proportional to V²hr. This signal is converted to a pulse train having a frequency proportional to amplitude of the output of the integrator. Offset correction is provided by means of up/down integration averaging wherein the input signal to the comparator is switched each time an output pulse is generated.

10 Claims, 1 Drawing Figure

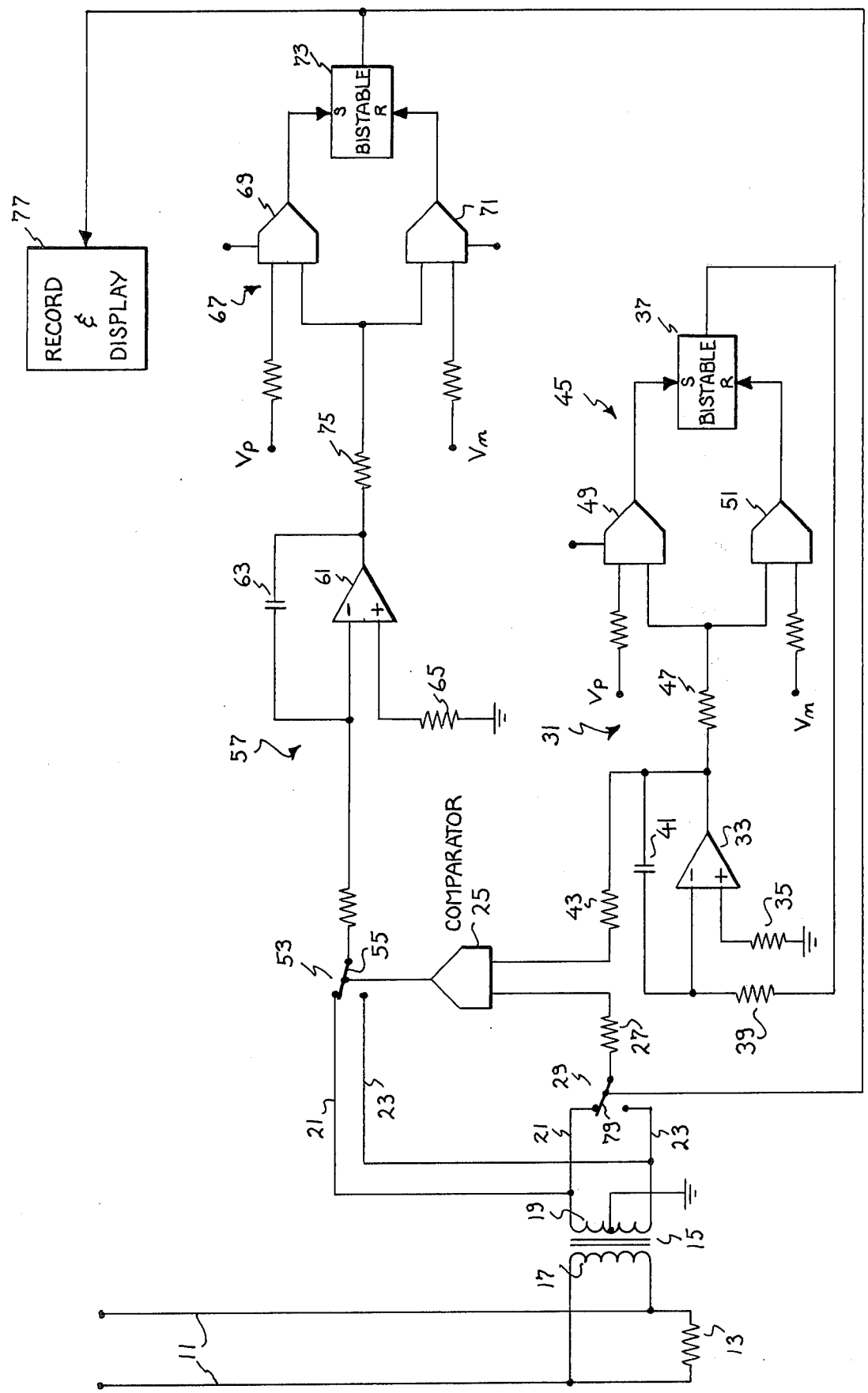

ELECTRONIC VOLT-SQUARE-HOUR METERING METHOD AND APPARATUS

BACKGROUND OF THE INVENTION

This invention relates to a method and apparatus for measuring volt-square-hours in an electrical system.

In the metering of electrical energy it is often advantageous to know the number of volt-square-hours ($V^2$hr) as, for example, in the measurement of apparent electrical power and energy. Apparent electrical power is the product of current and voltage, oftentimes expressed in kilovolt-amperes (kVa), and is independent of the phase angle between the current and voltage. Apparent electrical energy is expressed in kilovolt-ampere-hours (kVah) which is also independent of the phase angle between the current and the voltage. As is known in the art, both apparent electrical energy and apparent electrical power are proportional to $V^2$hr and $V^2$, respectively. In many instances, therefore, a simplified way of determining apparent electrical power or energy in a system is to determine the number of $V^2$hrs.

In the past, the metering of $V^2$hrs was obtained by electromechanical methods. Thus, in a conventional electromechanical watt hour meter, mechanical changes were required in order to convert the operation of the watt-hour meter to provide $V^2$hr metering. There accordingly has been a need in the art for providing an improved method and apparatus for providing volt$^2$ hour metering which does not require the mechanical changes presently required in conventional electromechanical watt-hour meters.

It accordingly is an object of this invention to provide an improved method and apparatus for providing a $V^2$hr meter.

SHORT STATEMENT OF THE INVENTION

Accordingly, this invention relates to an improved method and apparatus for electronically measuring $V^2$hrs in an electrical system. The apparatus includes a means for generating first and second analog signals which are proportional to a voltage in the system wherein the first analog signal is 189° out of phase with respect to the second analog signal. One of these signals is selected to be coupled to a comparator with the other input to the comparator being derived from a relatively high frequency triangular waveform generator. The comparator provides an output which is a pulse width modulated signal having a pulse duration which is proportional to the magnitude of the voltage in the electrical system. This signal is coupled to a multiplier which preferably takes the form of a switch, wherein the switch couples one of the analog signals to an integrator when a pulse exists at the output of the comparator, and connects the other analog signal to the integrator when such a pulse does not exist. Thus, the input to the integrator is a chopped analog signal having an amplitude which is proportional to the voltage in the electrical system, and a duration which is also proportional to the magnitude of the voltage in the electrical system, and accordingly the input to the integrator is proportional to $V^2$. The integrator converts the $V^2$ proportional signal to a signal which is proportional to $V^2$hr. This signal is converted to a pulse train having a pulse repetition rate which is proportional to the magnitude of the $V^2$hr signal. The pulse train is accumulated by a recording unit and appropriately displayed to give an indication of the $V^2$hr in the electrical system.

To improve the accuracy of the metering system of the present invention, offset correction is provided by alternately integrating up and down. Thus, each time a pulse is generated at the output of the analog-to-pulse-rate converter, the analog signal coupled to the comparator is inverted so that during one interval the integrator tends to integrate upwardly and then in the subsequent interval the integrator tends to integrate downwardly. Thus, error due to an offset signal in the integration step is effectively subtracted out.

BRIEF DESCRIPTION OF THE DRAWING

Other objects, features and advantages of the present invention will become more fully apparent from the following detailed description of the preferred embodiment, the appended claims and the accompanying drawing which is a schematic illustration of the preferred embodiment of the $V^2$hr meter of the present invention.

DETAILED DESCRIPTION OF THE PREFERRED EMBODIMENT

As illustrated in the FIGURE, an electrical system is depicted by the AC conducting lines 11 having a load represented by the resistor 13. It should be understood that in a typical electrical system the load will include not only resistance but also capacitance and inductance. However, for purposes of describing the present invention, only a resistor 13 is illustrated. A potential transformer 15 having a primary winding 17 is connected across the electrical system 11 to thereby act as a detector of the voltage within the system. The secondary 19 of the transformer 15 is center tapped to thereby derive two analog signals, each of which is proportional to the detected electrical voltage within the system and each of which is 180° out of phase with respect to one another. Thus, the signal on line 21 is in phase with the voltage across the primary winding 17, while the voltage on line 23 is 180° out of phase with the input voltage. The voltages on lines 21 and 23 are selectively coupled to one input of a comparator 25 which is of conventional design known in the art via input resistor 27 and up/down integration switch 29. The other input to the comparator 25 is derived from a triangular waveform generator generally identified by the numeral 31.

The triangular waveform generator 31 includes an integrator which comprises an amplifier 33 having the inphase input thereto grounded via resistor 35 and having the inverted input connected to the output of a flip-flop 37 via resistor 39. A feedback capacitor 41 is connected across the inverted input of the amplifier 33 and the output thereof to thereby provide a conventional integrator circuit. The output of the integrator is coupled to one input of the comparator 25 via resistor 43 and is also coupled to a pulse generating circuit 45 via resistor 47. The pulse generation circuit includes a first comparator 49 and a second comparator 51. The other input to the first comparator 49 is a fixed positive voltage $V_p$ and the other input to the comparator 51 is a constant negative voltage $V_n$. The outputs of the comparators 49 and 51 are connected to the set and reset inputs of flip-flop 37 respectively.

In operation, assume that the integrator is integrating upwardly in a positive direction, i.e., generating the positive-going portion of the triangular waveform. When the output voltage of the integrator reaches the voltage level $V_p$, comparator 49 generates an output pulse to set the flip-flop 37. A pulse is thereby derived at the output of flip-flop 37 which causes the integrator to start integrating downwardly. As the integrator integrates downwardly, i.e., generates an output voltage which goes in a negative direction, the negative-going portion of the triangular waveform is generated. When the integrator provides an output voltage which reaches the level $V_n$, comparator 51 generates an output signal for resetting the flip-flop 37. When this occurs, the output of the flip-flop 37 is switched to thereby cause the integrator to integrate upwardly again. This cycle repeats itself at a fairly rapid rate compared to the frequency of the line voltage in the electrical system 11. As an example in the preferred embodiment the line voltage may be the conventional 60-cycle voltage provided in electrical distribution systems. In such a case, the triangular waveform generator 31 preferably generates a triangular waveform having a frequency of about 10 kHz.

Referring back to the comparator 25, the output of the comparator is a pulse train wherein each of the pulses has a time duration which is proportional to the instantaneous amplitude of the line voltage in the electrical system 11. Thus, the output of the comparator 25 is a pulse width modulated signal having a duration which is proportional to the line voltage V. This signal is coupled to a switching circuit 53 which, as illustrated, is in mechanical form. However, it should be appreciated that the switch 53 can be a suitable electronic switching circuit of a suitable type well known in the art. When the output of the comparator is low, the switch arm 55 is connected to line 21 and therefore couples the in-phase analog signal to integrator 57 via input resistor 59. When the comparator output 25 is high, the switch arm 55 is connected to line 23 to thereby couple the out-of-phase analog signal to the integrator 57. Thus, it can be seen that the signal coupled to the integrator 57 is a chopped analog signal having an amplitude the magnitude of which is proportional to the line voltage in the electrical system 11 and having a duration which is proportional to the magnitude of the voltage in the system. Accordingly, the input signal to the integrator 57 is a chopped analog signal which is proportional to $V^2$.

The integrator 57 is of conventional design and includes an amplifier 61, a feedback integrating capacitor 63 and a resistor 65 which connects the non-inverting input of the amplifier 61 to ground. The output of the integrator 57 is a triangular signal having an amplitude which is proportional to $V_p$ and $V_n$. This signal is coupled to a pulse generating circuit 67 which in form is generally similar to the pulse generating circuit 45 in the triangular generator 31. Thus, the analog-to-pulse-rate converter includes the integrator 57, a pair of comparators 69 and 71 together with a flip-flop 73. The output of the integrator 57 is connected to one input of each of the comparators 69 and 71 via resistor 75. The other input to the comparator 69 is a positive voltage $V_p$. The other input to the comparator 71 is a negative voltage $V_n$. The outputs of the comparators 69 and 71 are connected to the set and reset inputs, respectively, of the flip-flop 73.

In operation, assume the integrator 57 is integrating upwardly. As the integration proceeds, the output of the integrator continues to rise until the voltage level $V_p$ is reached. When this occurs, an output signal is generated to the set input of the flip-flop 73. Flip-flop 73 thus generates a pulse output. This signal is coupled to a recording and display device 77 which is of conventional design known in the art. The output of the flip-flop 73 is also coupled to an up/down integration switch 29. The pulse causes the arm 79 of the switch 29 to make contact with circuit 23 to thereby effectively invert the input to the comparator 25. This causes the input to the integrator 57 to be primarily negative going, with of course the amplitude thereof being proportionate to the volts$^2$ in the electrical system 11. In this case, the integrator 57 integrates downwardly with this integration proceeding until the output voltage of the integrator reaches the level $V_n$. When this occurs, a reset pulse is generated by comparator 71 to the reset input of the flip-flop 73. Thus, the flip-flop 73 provides an output which permits the switch arm 79 of the up/down integration switch 29 to make contact again with circuit 21 so that the input to the comparator 25 is in-phase. When this occurs, the input signal to the integrator 57 is primarily positive going with the voltage input thereto being proportional to $V^2$. Thus, it can be seen that by the present invention offset correction is provided in the integration step by means of up/down integration averaging. Thus, the integrator 57 integrates for a first time interval $T_1$ while in effect summing the total offset signal. When the differential comparator threshold level is reached in comparator 69, the input signal to the comparator 25 is switched in polarity and thus the output of switch 53 changes polarity and the integrator 57 starts to integrate down for a second time interval $T_2$. Because the total offset signal does not change its polarity when the input signal to the comparator 25 is switched in polarity, the offset signal is in fact subtracting during the second time interval $T_2$. Thus the total offset is corrected over the total time period $T = T_1 + T_2$.

The present invention has been disclosed in connection with the preferred embodiment thereof. However, it should be understood that there may be other embodiments of the invention which fall within the spirit and scope thereof of defined by the appended claims.

What is claimed is:

1. An electronic meter for measuring volts-square-hours in an electrical system comprising:
   means for generating first and second analog signals, said signals being proportional to a voltage in said system, and said first analog signal being 180° out-of-phase with respect to said second analog signal,
   means for pulse width modulating one of said analog signals to derive a signal having a pulse width proportional to the amplitude of said analog signal,
   means for multiplying said pulse width amplitude by said first and second analog signals,
   means for integrating the output of said multiplying means to derive a signal proportional to volts-square-hours,
   means for converting said signal proportional to volts-square-hours to a pulse train proportional to volts-square-hours, and
   means for alternately coupling said first and second analog signals to said pulse width modulating means every nth time a pulse is generated by said converting means.

2. An electronic meter for measuring volts-square-hours in an electrical system comprising:
   means for generating first and second analog signals, said signals being proportional to a voltage in said system, and said first analog signal being 180° out-of-phase with respect to said second analog signal,
   means for generating a relatively high frequency triangular signal, a comparator, said triangular signal being coupled to one input of said comparator, switching means for selectively coupling one of said first and second analog signals to the other input of said comparator, the output of said comparator being a pulse width modulated signal having a pulse width proportional to the amplitude of the analog signal coupled to one input of said comparator, means for multiplying said pulse width modulated output signal of said comparator with a signal proportional to said voltage in said electrical system, the output of said multiplier having an amplitude proportional to the electrical voltage in said system and having a pulse width proportional to the amplitude of said electrical voltage in said electrical system, and an integrator, said integrator being connected to the output of said multiplier, the output of said integrator being proportional to volts-square-hours.

3. The meter of claim 1 further comprising a pulse generating circuit, the input of said circuit being connected to said integrator to thereby convert the output of said integrator to a pulse train having each pulse proportional to volts-square-hours, and means connected to said pulse generating circuit for recording and displaying the volts-square-hours in said electrical system.

4. The electronic meter of claim 3 wherein said pulse generating circuit comprises means for determining when the voltage level at the output of said integrator reaches a first predetermined positive level and means for detecting when the output of said integrator reaches a second negative level, and means responsive to said detecting means for generating an output pulse when said predetermined positive and negative levels are reached.

5. The meter of claim 4 wherein said switching means for selectively connecting said first or second analog signals to said comparator is driven by the output of said pulse generating circuit to thereby invert the analog signal coupled to said comparator each time a pulse is generated by said pulse generating circuit, said phase inversion causing said integrator to integrate in the opposite direction each time said pulse is generated to thereby correct offset integration errors in said meter.

6. The meter of claim 5 wherein said multiplying means comprises a switch, said switch selectively connecting said first or said second analog signals to said integrator in accordance with the output of said comparator.

7. An electronic meter for measuring volts-square-hours in an electrical system comprising:

means for generating first and second analog signals, said signals being proportional to a voltage in said system, and said first analog signal being 180° out-of-phase with respect to said second analog signal, means for generating a relatively high frequency triangular signal, a comparator, said triangular signal being coupled to one input of said comparator, switching means for selectively coupling one of said first and second analog signals to the other input of said comparator, the output of said comparator being a pulse width modulated signal having a pulse width proportional to the amplitude of the analog signal coupled to one input of said comparator, means for multiplying said pulse width modulated output signal of said comparator with a signal proportional to said voltage in said electrical system, the output of said multiplier having an amplitude proportional to the electrical voltage in said system and having a pulse width proportional to the amplitude of said electrical voltage in said electrical system, and an integrator, said integrator being connected to the output of said multiplier, the output of said integrator being proportional to volts-square-hours, a pulse generating circuit, the input of said converter being connected to said integrator to thereby convert the output of said integrator to a pulse train having each pulse proportional to volts-square-hours, wherein said switching means for selectively connecting said first or second analog signals to said comparator is driven by the output of said pulse generating circuit to thereby invert the analog signal coupled to said comparator every $n$th time a pulse is generated by said pulse generating circuit, said phase inversion causing said integrator to integrate in the opposite direction each time said $n$th pulse is generated to thereby correct offset integration errors in said meter.

8. The meter of claim 7 wherein said multiplying means comprises a switch, said switch selectively connecting said first or said second analog signals to said integrator in accordance with the output of said comparator.

9. The meter of claim 8 further comprising means connected to said pulse generating circuit for recording and displaying the volts-square-hours in said electrical system.

10. The electronic meter of claim 9 wherein said pulse generating circuit comprises means for determining when the voltage level at the output of said integrator reaches a first predetermined positive level and means for detecting when the output of said integrator reaches a second negative level, and means responsive to said detecting means for generating an output pulse when said predetermined positive and negative levels are reached.

* * * * *